United States Patent
Gonzalez et al.

(10) Patent No.: US 7,147,798 B2
(45) Date of Patent: Dec. 12, 2006

(54) AQUEOUS BASED METAL ETCHANT

(75) Inventors: Frank Gonzalez, Mesa, AZ (US); Emil Kneer, Mesa, AZ (US); Michelle Elderkin, Coventry, RI (US); Vince Leon, Scottsdale, AZ (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 2 days.

(21) Appl. No.: 10/921,785

(22) Filed: Aug. 19, 2004

(65) Prior Publication Data

US 2005/0040139 A1  Feb. 24, 2005

Related U.S. Application Data

(60) Provisional application No. 60/497,402, filed on Aug. 22, 2003.

(51) Int. Cl.
*C09K 13/00* (2006.01)
*H01L 21/302* (2006.01)

(52) U.S. Cl. .................... 252/79.1; 252/79.2; 438/745; 438/754

(58) Field of Classification Search ............... 252/79.1, 252/79.2; 438/745, 754
See application file for complete search history.

(56) References Cited

U.S. PATENT DOCUMENTS 5,972,862 A   10/1999   Torii et al.

OTHER PUBLICATIONS

International Search Report Application No. PCT/US04/26921, dated Apr. 19, 2006.

*Primary Examiner*—Nadine Norton
*Assistant Examiner*—Lynette T. Umez-Eronini
(74) *Attorney, Agent, or Firm*—Ohlandt, Greeley, Ruggiero & Perle, LLP

(57) ABSTRACT

The present invention provides an aluminum etchant solution for etching an aluminum surface in the presence of solder bumps. The etchant solution includes about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water; wherein the solder bumps are substantially phosphate free after the etching. Also provided is a process for etching an exposed aluminum surface in a semiconductor structure in the presence of solder bumps including the steps of: contacting the exposed aluminum surface with the etchant solution; rinsing the semiconductor structure with de-ionized water; and drying the semiconductor structure to remove residual water; wherein the solder bumps are substantially phosphate free after the etching.

6 Claims, No Drawings

US 7,147,798 B2

AQUEOUS BASED METAL ETCHANT

RELATED APPLICATIONS

This application claims priority from U.S. Provisional Patent Application No. 60/497,402 filed Aug. 22, 2003.

FIELD OF THE INVENTION

The present invention relates to a novel aqueous etchant solution composition for etching metal alloys. More specifically, the invention relates to an etchant blend that can etch aluminum and aluminum alloys cleanly in the presence of other metals.

BACKGROUND OF THE INVENTION

The formation of integrated circuit chips involves many processes. From design to production, each aspect requires considerable attention to details and precision to create and maintain high yield of functioning chips. The metal most commonly used for connecting device parts and interconnecting integrated circuits is aluminum. During the manufacture of the devices, etching aluminum features is required. Specialized aluminum etches are required for various situations found in different approaches to devices and device manufacture to optimize yield and device life. Frequently the ability to selectively etch certain metals (e.g. aluminum) in the presence of other metals is advantageous.

The increasing density of contact terminals for input/output connections in wire bonded devices resulted in overcrowding around the periphery of the device which causes low device yields and early device failures. Solder bumping is one method employed to solve the high-density interconnection problem. In this method, the interconnections are rerouted to various points on the surface of the device not on the periphery of the device.

There are various approaches and materials employed in the production of solder bumps, such as described in U.S. Pat. Nos. 5,508,229, 6,130,141, 6,258,708, 5,902,686, 6,015,652, 5,137,845, 5,773,359, 57,364,456, 4,927,505, 5,904,859, 5,162,257, 5,327,013, and 5,903,058 and U.S. applications Ser. Nos. 09/961037 and 10/003240 herein incorporated by reference.

A solder bump is generally a relatively low melting metal alloy that is placed on a metal pad connected to various circuits. Various materials such as Sn, Pb, Au, Ag, and Cu have been employed as bump components, typically as alloys. A common bump alloy is Sn/Pb alloy.

When making interconnections, the bumps are aligned with the connection points on the device or package to which it is being interconnected and then heated to reflow the solder bumps so that good connections between the circuits are made. The integrity of the solder bump determines the reliability and the chip's functionality.

The metal most commonly used for interconnecting integrated circuits is aluminum. However, techniques for solder bumping directly to aluminum have not been generally successful, so other metals, usually multiple layers of them, are placed between the bump and the aluminum contact pad. These metals are called under bump metals (UBM). These metals are applied to ensure adhesion, provide oxidation protection, wettability to solder, and to provide barrier layers to prevent migration of certain metals. Examples of common under bump metals include Ni, V, Ti, W, Cu, Al, Au, Cr, or their alloys. These metals may be deposited and patterned to cover the metal pad or may be deposited through holes in a removable mask that are over the metal pads. The solder bumps are then applied through a mask, typically through electroplating. The mask is then removed.

Depending on the exact manufacturing techniques employed, Al etching may be done in the presence of the bump and thus also in the presence of the under bump metals such as NiV alloy and Ti. This requires a selective etching process and selective etchant. U.S. applications Ser. Nos. 09/961037 and 10/003240 describe situations in which a selective etchant might be useful.

Aluminum brighteners, cleaners, and etchants typically include phosphoric acid and nitric acid as described in U.S. Pat. Nos. 5,464,500, 6,127,279, 4,230,522, 4,022,930, 4,629,539, 4,857,225, 3,715,250, and 3,645,790. However, when etching aluminum with etchants having phosphoric acid in the presence of the commonly used Sn/Pb solder bumps, there is an undesired side reaction with the bump leading to growth of insoluble phosphate precipitates which may lead to poor device life and shorted circuits unless prevented or removed. An etchant that prevents such precipitates is desired to increase device yields and lifetime.

Numerous etchant blends composed of acids to etch aluminum and other metals are known in the art. U.S. Pat. No. 5,258,093 describes an etchant solution for fabrication of ferroelectric capacitors derived by mixing a water and nitric/phosphoric/acetic acid composition with a platinum etch composition of water and hydrochloric/nitric acid composition. This produced an aqueous four acid blend of nitric/phosphoric/acetic/hydrochloric acid that was high in hydrochloric and nitric acid content. JP 2002208704 described a blend of nitric/phosphoric/acetic/hydrochloric acids for etching molybdenum thin films. U.S. Pat. No. 4,707,191 describes a mixture of aqueous nitric/phosphoric/acetic/hydrochloric acids and a ferric salt for pickling NiMo alloy. JP2003013261 describes a nitric acid/phosphoric acid, organic acid/amine or ammonium base blend composition used for etching aluminum or aluminum alloys. U.S. Pat. No. 4,895,617 describes an aluminum etchant having water and nitric/phosphoric/acetic and an amine oxide surfactant. U.S. Pat. No. 5,300,172 describes an adhesion tape surface protection method while etching plate materials with an etchant composition containing at least one compound selected from a group that contains hydrogen chloride, nitric acid, acetic acid, and phosphoric acid. However, no specific benefits were defined for any acid combinations and only a mixture of hydrofluoric acid and nitric acid was specifically mentioned. JP06041770 discloses a treating method for silicon wafer surfaces that employs a cleaning solution containing at least one of a group of compounds which contains hydrogen chloride, nitric acid, acetic acid, and phosphoric acid and an anionic or nonionic surfactant or a blend of the two types of surfactant. However, no specific benefits were defined for any acid combinations and only binary combinations were employed.

It is an object of this invention to provide an aluminum etchant that does not produce insoluble phosphate residues when etching aluminum in the presence of Sn Pb solder bumps. It is another object of this invention to provide a process of use for the selective etchant.

SUMMARY OF THE INVENTION

The present invention provides an aluminum etchant solution, which includes: about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water. The aluminum etchant solution can be used for etching aluminum in the presence of solder bumps such that the solder bumps are substantially phosphate free after the etching.

The present invention further provides a process for etching an exposed aluminum surface in a semiconductor structure. The process includes the step of:

contacting the exposed aluminum surface with an etchant solution, including: about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water; wherein the contacting is carried out for a period of time sufficient to etch the aluminum surface. In one embodiment, the present invention provides a process for fabricating a semiconductor structure, having the steps of:

providing a semiconductor structure having an exposed aluminum surface and solder bumps;

contacting the exposed aluminum surface and the solder bumps with an etchant solution for a period of time sufficient to etch the aluminum surface; wherein the etchant solution includes: about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water;

rinsing the semiconductor structure with de-ionized water; and drying the semiconductor structure to remove residual water;

wherein the solder bumps are substantially phosphate free after the etching.

In a particularly preferred embodiment, the present invention provides a method of selectively etching an exposed aluminum surface on a semiconductor structure having an exposed aluminum surface, an exposed metal surface, such as, Ni, a Ni alloy and Ti, and solder bumps. The method includes the steps of:

contacting the exposed aluminum surface, the metal surface and the solder bumps with an etchant solution, wherein the etchant solution includes: about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water; wherein the contacting is carried out for a period of time sufficient for selectively etching the aluminum surface without etching the Ni, a Ni alloy and Ti metal surfaces;

rinsing the semiconductor structure with de-ionized water; and drying the semiconductor structure to remove residual water;

wherein the aluminum surface is selectively etched without etching the Ni, a Ni alloy and Ti metal surface; and wherein the solder bumps are substantially phosphate free after the etching.

DETAILED DESCRIPTION OF THE INVENTION

The present invention provides an aluminum etchant composition useful for etching in the presence of solder bumps that prevents formation of phosphate precipitates on the solder bump. The etchant composition includes: about 42% to about 80% phosphoric acid, about 0.1% to about 6% nitric acid, about 5% to about 40% acetic acid, about 0.005% to about 5% of an amine oxide surfactant, about 0.1% to about 8% of a Pb solubilizing additive, and about 5 to about 25% de-ionized water.

The composition may be prepared in any suitable container in any order. A preferred method, for safety reasons, is to add water as the first ingredient or alternatively and aqueous solution of one of the components. For example, first add the desired amount of water, followed by adding the desired amount of phosphoric acid, followed by the desired amount of nitric acid, followed by the desired amount of acetic acid, followed by the desired amount of Pb solubilizing additive and followed finally by the addition of the surfactant. A form of consistent agitation should be applied continuously during the addition of the components to achieve a homogeneous final solution. External cooling may be applied as desired to keep the temperature of the formulation near room temperature. The final product is then recirculated through a 0.2μ filter to remove undesired particles.

The etchant composition includes from about 42 to about 80% phosphoric acid. While not wishing to be bound by theory, it is believed that the phosphoric acid and water is used to dissolve aluminum oxide formed by the reaction of aluminum with nitric acid. Higher phosphoric acid content improves the selectivity of the aluminum etch relative to NiV and Ti. A preferred range for phosphoric acid is from about 50 to about 75% by weight. A more preferred range is from about 55 to about 75% by weight. A most preferred range is from about 60 to about 75% by weight.

The composition further includes about 0.1 to about 6% nitric acid. While not wishing to be bound by theory, it is believed that the nitric acid oxidizes the aluminum to aluminum oxide, which is then dissolved by other components. A preferred range for nitric acid is from about 0.1 to about 5% by weight. A more preferred range is from about 0.5 to about 4% by weight. A most preferred range is from about 0.5 to about 3% by weight.

The composition further includes about 5 to about 40% acetic acid. Acetic acid is useful for balancing the activities of the nitric and phosphoric acids and decreasing the etch rate of the NiV and the Ti. A preferred range for acetic acid is from about 5 to about 30% by weight. A more preferred range for acetic acid is from about 5 to about 20% by weight. A most preferred range for acetic acid is from about 5 to about 10% by weight.

The etchant composition further includes about 0.005% to about 5% of an amine oxide surfactant. The surfactant is believed to aid in promoting consistent etch rates over the entire etch surface and to lower the number of defects in the etched aluminum. A preferred range of amine oxide surfactant is from about 0.01% to about 1%. A more preferred range of amine oxide surfactant is from about 0.01 to about 0.5% by weight. A most preferred range of amine oxide surfactant is from about 0.01 to about 0.05% by weight.

The etchant composition further includes about 0.1% to about 8% by weight of a Pb solubilizing additive. A preferred range for the Pb solubilizing additive is from about 0.2% to about 6% by weight. A more preferred range for the Pb solubilizing additive is from about 0.5 to about 4% by weight. The most preferred range for the Pb solubilizing additive is from about 1% to about 3% by weight.

Without wishing to be bound by theory, it is believed that the inclusion of an additive whose anion can form a water soluble salt with Pb results in the prevention of insoluble phosphates on the bump. The additive may be a covalent compound or a salt. Suitable salt cations include alkali metal cations, ammonium and quaternary ammonium cations. Ammonium and quaternary ammonium salts are preferred. Examples of suitable salt anions include hexfluorosilicate, thiosulfate, acetate, chlorate, perchlorate, chloride, bromate, nitrate, or citrate. Examples of suitable Pb solubilizing additives include bromic acid, perchloric acid, HCl, ammonium chloride, tetramethyl ammonium chloride, ammonium acetate, ammonium hexfluorosilicate, tetramethyl ammonium acetate, chloric acid, perchloric acid, ammonium chlorate, ammonium perchlorate, ammonium thiosulfate, ammonium citrate, citric acid and a mixture thereof. The additive may affect the aluminum etch rate and the relative etch rates of other metals exposed to the etchant. Preferred additives are bromic acid, perchloric acid, and HCl. More preferred additives are perchloric acid, and HCl. The most preferred additive is HCl.

The etchant composition further includes about 5 to about 25% by weight de-ionized water. Water is use to dilute the etchant to help control etchant activity and dissolve aluminum etch products. A preferred range for de-ionized water is from about 5 to about 20% by weight of the etchant composition. A more preferred range is from about 5 to about 15% by weight of the etchant composition. A most preferred range is from about 10 to about 15% by weight of the etchant composition.

A more preferred etchant composition is one which can selectively etch aluminum at a sufficiently fast rate in the presence of Sn Pb solder bumps without formation of phosphate residues while at the same time maintaining a low etch rate on NiV and Ti. Such compositions would include from about 55 to about 75% phosphoric acid, from about 0.5 to about 4% nitric acid, from about 5 to about 20% acetic acid, from about 0.01 to about 0.05% amino oxide surfactant, from about 0.5 to about 4% Pb solubilizing additive, and from about 5 to about 15% de-ionized water. A most preferred composition would include from about 60 to about 75% phosphoric acid, from about 0.05 to about 3% nitric acid, from about 5 to about 10% acetic acid, from about 0.01 to about 0.05% amino oxide surfactant, from about 1 to about 3% Pb solubilizing additive, and from about 10 to about 15% de-ionized water.

Another aspect of the invention is a semiconductor fabrication process for etching aluminum in the presence of solder bumps, including the steps of:
1. providing a semiconductor structure with exposed aluminum surfaces,
2. contacting the aluminum surfaces with an etchant solution including:
   a. about 42% to about 80% phosphoric acid,
   b. about 0.1% to about 6% nitric acid,
   c. about 5% to about 40% acetic acid,
   d. about 0.005% to about 5% of an amine oxide surfactant,
   e. about 0.1% to about 8% of a Pb solubilizing additive, and
   f. about 5 to about 25% de-ionized water for a time sufficient for etching the aluminum,
3. rinsing the semiconductor structure with de-ionized water, and
4. drying the semiconductor structure to remove residual water wherein the solder bumps are substantially phosphate free after the etch process.

The present invention also provides a process for etching aluminum surfaces in semiconductor structures. Such semiconductor structures are generally constructed as sub-regions on a silicon wafer. The process includes the step of: contacting the exposed aluminum surface with an etchant solution, including: about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water; wherein the contacting is carried out for a period of time sufficient to etch the aluminum surface. Preferably, the aluminum surface in the semiconductor structure further includes solder bumps, such that the solder bumps are substantially phosphate free after the etching. The process can further include the step of rinsing the semiconductor structure with de-ionized water and drying to remove residual water. Any suitable method of contacting the aluminum surfaces with the etchant may be employed. The contacting step is typically carried out by a method, such as, multiple wafer (batch) immersion, multiple wafer spraying, single wafer immersion, single wafer spraying, or single wafer spray puddle, preferably for a period of time from about 30 seconds to about 10 minutes and more preferably from about 1 seconds to about 10 minutes. Due to the limited amount of etchant contacting the wafer in a spray puddle process, multiple spray puddle cycles may be required depending on the thickness of the aluminum. For most methods, the etchant may be reused in which case it is preferred to employ point-of-use filtration remove etch generated byproducts.

Wet etch of aluminum or aluminum alloy films is typically done in heated solutions to achieve a stable and predictable process. Process temperatures may range from about 26° C. to about 55° C. A preferred temperature range is from about 26° C. to about 45° C. A more preferred temperature range is from about 26° C. to about 40° C. A most preferred temperature range is from about 30° C. to about 35° C. The etch rate of the composition is dependant on several factors including etchant composition, temperature, agitation of wafers during etch, and impurities or alloys in the predominantly aluminum film. Relative etch rates of other metals may change with temperature or other variables and so performance of the etchant may be optimized by optimizing these parameters in the etch process.

Any suitable process time may be employed. The time will depend on the thickness of the layer being etched and the particular composition of the etchant. However, it is advisable to terminate the etch process shortly after the aluminum etching has been completed, so that isotropic etching is minimized. Process times may typically range from about 30 seconds to about 10 minutes. A preferred time range is from about 1 minute to about 10 minutes. A more preferred time range is from about 2 to about 6 minutes. A most preferred time range is from about 2 to about 4 minutes.

During the etch process, mild agitation must be used to remove by-products of the etch process that can accumulate on the aluminum surface and decrease the etch rate. Any suitable agitation means for moving the wafer relative to the etchant may be employed. Examples of suitable agitation means include vibration, up and down or back and forth movements, rotational movements, and ultrasonic agitation.

After etch, processed wafers are rinsed with de-ionized water. Any suitable method of rinsing may be employed. Examples of suitable rinse methods include, but are not limited to, multiple wafer immersion, single wafer immersion, multiple wafer spray, and single wafer spray. The rinse is continued until the etchant is completely removed from the wafer surface. The amount of water employed and the time will depend on the efficiency of the rinsing technique. Incomplete removal of the etchant may cause corrosion over time and subsequent device failure. Wafers are typically rinsed for a time ranging from about 3 to about 10 minutes. A preferred time range is from about 3 minutes to about 10 minutes. A more preferred time range is from about 3 minutes to about 8 minutes. A most preferred time range is from about 3 minutes to about 5 minutes.

Wafers are then dried. Any suitable drying means may be employed. Examples of suitable drying means include, but are not limited to, spinning on a wafer chuck, spinning in a spin rinse dryer (SRD), being drying in a stream of dry gas such as air or nitrogen, and employing a heating means such as a hot plate or oven.

Thus, the present invention provides a process for fabricating a semiconductor structure including the steps of: providing a semiconductor structure having an exposed aluminum surface and solder bumps; contacting the exposed aluminum surface and the solder bumps with an etchant solution for a period of time sufficient to etch the aluminum surface; wherein the etchant solution includes: about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water; rinsing the semiconductor structure with de-ionized water; and drying the semiconductor structure to remove residual water; wherein the solder bumps are substantially phosphate free after the etching.

The semiconductor structure can further include a metal surface, such as, Ni, a Ni alloy and Ti but the aluminum surface can be selectively etched without etching the Ni, a Ni alloy and Ti metal surfaces.

Thus, the present invention provides a method of selectively etching an exposed aluminum surface on a semiconductor structure having an exposed aluminum surface, an exposed metal surface, such as, Ni, a Ni alloy and Ti, and solder bumps; the method including the steps of:

contacting the exposed aluminum surface, the metal surface and the solder bumps with an etchant solution, wherein the etchant solution includes about 42% to about 80% phosphoric acid; about 0.1% to about 6% nitric acid; about 5% to about 40% acetic acid; about 0.005% to about 5% of an amine oxide surfactant; about 0.1% to about 8% of a Pb solubilizing additive; and about 5 to about 25% de-ionized water; wherein the contacting is carried out for a period of time sufficient for selectively etching the aluminum surface without etching the Ni, a Ni alloy and Ti metal surfaces;

rinsing the semiconductor structure with de-ionized water; and drying the semiconductor structure to remove residual water;

wherein the aluminum surface is selectively etched without etching the Ni, a Ni alloy and Ti metal surface; and wherein the solder bumps are substantially phosphate free after the etching.

To illustrate the present invention, the following examples are provided. It should be understood that the present invention is not limited to the examples described.

EXPERIMENTAL

General Procedure for Etchant Formulation

A 500 ml glass beaker was charged with an aqueous solution of phosphoric acid and a Teflon coated stir bar. To the stirred aqueous phosphoric acid was added slowly in the following order nitric acid, acetic acid, additive, and the amine oxide surfactant. The etchant composition was stirred for 5 minutes after addition and then poured into a Teflon bottle until needed.

General Procedure for Determining Etch Rates of Metals 8 inch silicon wafers were obtained with coatings of either Ti (1K angstroms), NiV (3700 angstroms), or Al (10 K angstroms). The wafers were broken into 1" by 1" pieces for etching experiments and weighed on a microbalance. In an etching experiment, the wafer piece was submerged in 300 ml of etchant stirred by a Teflon stir bar at 360 rpm in a 500 ml beaker. The temperature was as noted for the individual experiments. The wafer piece was rinsed in a stream of de-ionized water for two minutes at room temperature. The wafer piece was then blown completely dry using filtered nitrogen and weighed.

The etch rate for the metal (angstroms/min) was calculated by the following formula:

$$(WL \times 10^8 \text{ Angstroms})/(D \times A \times T)$$

where WL=weight loss during etching in grams
D=density of metal being etched in g/cm$^3$
A=the surface area of the metal being etched in cm$^2$
T=time in minutes

COMPARATIVE EXAMPLES 1–16

Etchant formulations were prepared according to the General Procedure for Etchant Formulation. The compositions are listed in Table 1 as parts by weight. The surfactant employed was VAROX 365 (identified as N,N-dimethyl lauryl amine oxide). The etch rates of Al, NiV, and Ti were determined according to the General Procedure for Determining Etch Rates of Metals. The data is reported in Table 3.

TABLE 1

| Example | HNO$_3$ | H$_3$PO$_4$ | CH$_3$CO$_2$H | DI H$_2$O | SURF. | HF | BORIC ACID | HCL |
|---|---|---|---|---|---|---|---|---|
| Comparative Ex. 1 | 2 | 70 | 10 | 18 | 0 | 0 | 0 | 0 |
| Comparative Ex. 2 | 2 | 20 | 10 | 68 | 0 | 0 | 0 | 0 |
| Comparative Ex. 3 | 10 | 50 | 20 | 20 | 0 | 0 | 0 | 0 |
| Comparative Ex. 4 | 4 | 50 | 20 | 26 | 0 | 0 | 0 | 0 |
| Comparative Ex. 5 | 10 | 30 | 20 | 40 | 0 | 0 | 0 | 0 |
| Comparative Ex. 6 | 4 | 50 | 20 | 25.98 | 0.025 | 0 | 0 | 0 |
| Comparative Ex. 7 | 10 | 50 | 20 | 19.98 | 0.025 | 0 | 0 | 0 |
| Comparative Ex. 8 | 2 | 70 | 10 | 17.975 | 0.025 | 0 | 0 | 0 |
| Comparative Ex. 9 | 2 | 50 | 5 | 42.98 | 0.025 | 0 | 0 | 0 |
| Comparative Ex. 10 | 2 | 50 | 15 | 32.98 | 0.025 | 0 | 0 | 0 |
| Comparative Ex. 11 | 8 | 50 | 5 | 36.98 | 0.025 | 0 | 0 | 0 |

TABLE 1-continued

| Example | HNO₃ | H₃PO₄ | CH₃CO₂H | DI H₂O | SURF. | HF | BORIC ACID | HCL |
|---|---|---|---|---|---|---|---|---|
| Comparative Ex. 12 | 8 | 50 | 15 | 26.98 | 0.025 | 0 | 0 | 0 |
| Comparative Ex. 13 | 4 | 50 | 34 | 11.98 | 0.025 | 0 | 0 | 0 |
| Comparative Ex. 14 | 0.85 | 70.75 | 10.81 | 15.64 | 0.025 | 1.07 | 0.85 | 0 |
| Comparative Ex. 15 | 0.85 | 70.75 | 10.81 | 15.64 | 0.025 | 1.07 | 0.85 | 0 |
| Comparative Ex. 16 | 5 | 50 | 0 | 43 | 0 | 0 | 0 | 2 |

EXAMPLES 1–4

Etchant formulations were prepared according to the General Procedure for Etchant Formulation. The compositions are listed in Table 2 as parts by weight. The surfactant employed was VAROX 365 (identified as N,N-dimethyl lauryl amine oxide). The etch rates of Al, NiV, and Ti were determined according to the General Procedure for Determining Etch Rates of Metals. The data is reported in Table 3.

TABLE 2

| Example | HNO₃ | H₃PO₄ | CH₃CO₂H | DI H₂O | SURF. | HCl |
|---|---|---|---|---|---|---|
| Example 1 | 3.4 | 42.6 | 29 | 19.475 | 0.25 | 5.5 |
| Example 2 | 2 | 50 | 29 | 16.975 | 0.25 | 2 |
| Example 3 | 2 | 50 | 39 | 3.97 | 0.25 | 5 |
| Example 4 | 0.808 | 68 | 8.5 | 21.267 | 0.25 | 1.4 |

TABLE 3

| | Etch rate | (Angstroms/minute) | | Temperature |
|---|---|---|---|---|
| Example | Al | NiV | Ti | (° C.) |
| Comparative Ex. 1 | 1714 | 105 | 0 | 40 |
| Comparative Ex. 2 | 0 | 67 | 0 | 40 |
| Comparative Ex. 3 | 1459 | 134 | 0 | 40 |
| Comparative Ex. 4 | 955 | 46 | 0 | 40 |
| Comparative Ex. 5 | 510 | 125 | 0 | 40 |
| Comparative Ex. 6 | 888 | 37 | 0 | 40 |
| Comparative Ex. 7 | 2103 | 135 | 74 | 40 |
| Comparative Ex. 8 | 970 | 178 | 0 | 40 |
| Comparative Ex. 9 | 187 | 295 | 284 | 40 |
| Comparative Ex. 10 | 399 | 217 | 220 | 40 |
| Comparative Ex. 11 | 1564 | 67 | 87 | 40 |
| Comparative Ex. 12 | 1970 | 0 | 319 | 40 |
| Comparative Ex. 13 | 803 | 0 | 0 | 40 |
| Comparative Ex. 14 | 1571 | 0 | 251 | 40 |
| Comparative Ex. 15 | 852 | 414 | 94 | 35 |
| Comparative Ex. 16 | 4257 | 574 | 6282 | 40 |
| Example 1a | 183 | 0 | 0 | 16 |
| Example 1b | 1976 | 0 | 138 | 27 |
| Example 1c | 4220 | 0 | 754 | 36 |
| Example 2 | 1047 | 0 | 492 | 25 |
| Example 3 | 1261 | 0 | 528 | 25 |
| Example 4a | 243 | 0 | 27 | 20 |
| Example 4b | 547 | 0 | 0 | 26 |
| Example 4c | 885 | 0 | 0 | 36 |

These results illustrate that etch rate and etch rate ratios can vary with temperature and etchant composition. The data also shows that a reasonable degree of selectivity of Al over NiV and Ti can be obtained with and without the Pb solubilizing additive, but that the compositions required to have a similar etch rate are different. (Comparative Example 6 vs Example 4)

General Procedure for Etching Metal Substrates Containing Bumps.

8" silicon wafers were obtained which contained Sn Pb bumps over a NiV/Ti/Al/Ti stack. In non-bumped areas the top surface was Al. The wafers were broken into 1" by 1" pieces and etched as in the General Procedure for Determining Etch Rates of Metals described above. Samples were inspected for phosphate residue using a Scanning Electron Microscope (SEM) to image it and to generate output for an Energy Dispersive X-Ray Spectrometer (EDX) to analyze elemental composition.

EDX identifies the elemental composition of materials imaged in a Scanning Electron Microscope (SEM) for all elements with an atomic number greater than boron. Most elements are detected at concentrations on the order of 0.1%. As the electron beam of the SEM is scanned across the sample surface, it generates X-ray fluorescence from the atoms in its path. The energy of each X-ray photon is characteristic of the element from which it is produced. The EDX microanalysis system collects the X-rays, sorts and plots them by energy, and automatically identifies and labels the elements responsible for the peaks in this energy distribution.

EXAMPLES 5–15 AND COMPARATIVE
EXAMPLES 17–22

Various Al etch formulations were tested for the capability of providing clean, residue free etching in the presence of Sn Pb solder bumps according to the General Procedure for Etching Metal Substrates Containing Bumps. Specific process conditions and the resulting data are reported in Table 4. EDX values are reported in weight %.

TABLE 4

| Example | Formulation | Process Temp (° C.) | Process Time (Min) | EDX Data Sn | Phos. | Pb | Solder Bump Topography by SEM |
|---|---|---|---|---|---|---|---|
| Comp. Ex. 17 | Comp. Ex. 6 | 40 | 4:51 | 1.38 | 8.07 | 79.86 | Residue |
| Comp. Ex. 18 | Comp. Ex. 6 | 40 | 4:35 | 0 | 8.53 | 80.68 | Residue |

TABLE 4-continued

| Example | Formulation | Process Temp (° C.) | Process Time (Min) | EDX Data Sn | Phos. | Pb | Solder BumpTopography by SEM |
|---|---|---|---|---|---|---|---|
| Comp. Ex. 19 | Comp. Ex. 12 | 40 | 4:10 | 1.68 | 4.8 | 78.96 | Residue |
| Comp. Ex. 20 | Comp. Ex. 13 | 40 | 6:00 | 2.58 | 7.32 | 64.43 | Residue |
| Comp. Ex. 21 | Comp. Ex. 14 | 40 | 4:49 | 1.45 | 7.98 | 79.56 | Residue |
| Comp. Ex. 22 | Comp. Ex. 15 | 35 | 7:45 | 1.77 | 8.14 | 79.48 | Residue |
| Example 5 | Example 1 | 16 | 2:42 | 0.96 | 0 | 94.87 | No Residue |
| Example 6 | Example 1 | 27 | 0:51 | 1.55 | 0 | 94.63 | No Residue |
| Example 7 | Example 1 | 36 | 0:31 | 1.6 | 0 | 94.89 | No Residue |
| Example 8 | Example 2 | 25 | 1:45 | 1.6 | 0 | 91.92 | No Residue |
| Example 9 | Example 3 | 25 | 1:40 | 1.15 | 0.33 | 94.76 | Residue |
| Example 10 | Example 3 | 25 | 2:40 | 1.54 | 0 | 93.89 | No Residue |
| Example 11 | Example 4 | 26 | 1:45 | 2.91 | 0 | 97.09 | No Residue |
| Example 12 | Example 4 | 26 | 3:20 | 2.89 | 0 | 97.11 | No Residue |
| Example 13 | Example 4 | 40 | 1:28 | 2.91 | 0 | 97.09 | No Residue |
| Example 14 | Example 4 | 20 | 2:08 | 2.97 | 0 | 97.03 | No Residue |
| Example 15 | Example 4 | 35 | 0:54 | 2.99 | 0 | 97.01 | No Residue |

These results show that all formulations without the Pb solubilizing additive had phosphate residues and that from all formulations with the Pb solubilizing additive, residue free etching could be obtained at lower temperatures and shorter times.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. An aluminum etchant solution comprising:
    about 42% by weight to about 80% by weight phosphoric acid;
    about 0.1% by weight to about 6% by weight nitric acid;
    about 5% by weight to about 40% by weight acetic acid;
    about 0.005% by weight to about 5% by weight of an amine oxide surfactant;
    about 0.1% by weight to about 8% by weight of a Pb solubilizing additive; and
    about 5% by weight to about 25% by weight de-ionized water.

2. An aluminum etchant solution for etching an aluminum surface in the presence of solder bumps, said etchant solution comprising:
    about 42% by weight to about 80% phosphoric acid;
    about 0.1% by weight to about 6% by weight nitric acid;
    about 5% by weight to about 40% by weight acetic acid;
    about 0.005% by weight to about 5% by weight of an amine oxide surfactant;
    about 0.1% by weight to about 8% by weight of a Pb solubilizing additive; and
    about 5% by weight to about 25% by weight de-ionized water;
    wherein said solder bumps are substantially phosphate free after the etching.

3. The aluminum etchant solution of claim 2, wherein said aluminum etchant solution does not produce insoluble phosphate residues when the aluminum is etched in the presence of Sn Pb solder bumps.

4. The aluminum etchant solution of claim 2, comprising:
    about 55% by weight to about 75% by weight phosphoric acid;
    about 0.5% by weight to about 4% by weight nitric acid;
    about 5% by weight to about 20% by weight acetic acid;
    about 0.01% by weight to about 0.05% by weight of an amine oxide surfactant;
    about 0.5% by weight to about 4% by weight of a Pb solubilizing additive; and
    about 5% by weight to about 15% by weight de-ionized water.

5. The aluminum etchant solution of claim 2, comprising:
    about 60% by weight to about 75% by weight phosphoric acid;
    about 0.05% by weight to about 3% by weight nitric acid;
    about 5% by weight to about 10% by weight acetic acid;
    about 0.01% by weight to about 0.05% by weight of an amine oxide surfactant;
    about 1% by weight to about 3% by weight of a Pb solubilizing additive; and
    about 10% by weight to about 15% by weight de-ionized water.

6. The aluminum etchant solution of claim 2, wherein said Pb solubilizing additive is selected from the group consisting of: bromic acid, perchloric acid, HCl, ammonium chloride, tetramethyl ammonium chloride, ammonium acetate, ammonium hexfluorosilicate, tetramethyl ammonium acetate, chloric acid, perchloric acid, ammonium chlorate, ammonium perchlorate, ammonium thiosulfate, ammonium citrate, citric acid and mixtures thereof.

* * * * *